United States Patent
Weiss et al.

(10) Patent No.: US 7,015,062 B1
(45) Date of Patent: Mar. 21, 2006

(54) MOLECULAR RULER FOR SCALING DOWN NANOSTRUCTURES

(75) Inventors: Paul S. Weiss, State College, PA (US); Anat Hatzor, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 130 days.

(21) Appl. No.: 09/873,614

(22) Filed: Jun. 4, 2001

Related U.S. Application Data

(60) Provisional application No. 60/209,377, filed on Jun. 5, 2000.

(51) Int. Cl.
  *H01L 51/40* (2006.01)
(52) U.S. Cl. .......................................... 438/99; 257/40
(58) Field of Classification Search .................. 438/11, 438/14, 780, 951, 670, FOR. 385–405, 99; 257/48, 40; 435/6
See application file for complete search history.

(56) References Cited

U.S. PATENT DOCUMENTS

| | | | | |
|---|---|---|---|---|
| 4,745,042 A | * | 5/1988 | Sasago et al. | |
| 5,589,692 A | * | 12/1996 | Reed | 257/23 |
| 5,627,090 A | * | 5/1997 | Marukawa et al. | 438/167 |
| 6,060,327 A | * | 5/2000 | Keen | 204/403.14 |
| 6,090,933 A | * | 7/2000 | Kayyem et al. | 536/25.3 |
| 6,131,580 A | * | 10/2000 | Ratner et al. | 128/898 |
| 6,231,668 B1 | * | 5/2001 | Loesch et al. | |
| 6,232,706 B1 | * | 5/2001 | Dai et al. | 313/309 |
| 2002/0190759 A1 | * | 12/2002 | Tour et al. | 327/1 |
| 2004/0110350 A1 | * | 6/2004 | Pang et al. | 438/299 |

OTHER PUBLICATIONS

Hoechst AG 1999 Derwent Information LTD 1976-32210X.*
Shinji Matsui, Nanostructure Fabrication Using Electron Beam and Its application to Nanometer Devices (IEEE vol. 85, No. 4, Apr. 1997).*
Hoechst AG, Aromatic amides of mercapto-alkanoic acids-used as adhesive agents for photo-polymerisable copying layers an copper emulsion carriers (1999 Derwent Information LTD 1976-32210X).*
J. Am. Chem. Soc. 1991, 113, 5866-5868.
Advanced Materials—"Communications" "Engineering the Microfabrication of Layer-by-Layer Thin Films", by Sarah L. Clark and Paul T. Hammond.

* cited by examiner

*Primary Examiner*—Matthew Smith
*Assistant Examiner*—Khiem Nguyen
(74) *Attorney, Agent, or Firm*—Gifford, Krass, Groh, Sprinkle, Anderson, & Citkowski, P.C.

(57) ABSTRACT

The present invention is a method and apparatus relating to manufacturing nanostructure patterns and components using molecular science. The method includes overlaying a multilayer organic molecule resist on at least a portion of a parent structure selectively deposited on a substrate, depositing a layer over the parent structure and in contact with at least a portion of the multilayer organic resist, and removing the multilayer organic molecule resist to leave a residual structure.

33 Claims, 3 Drawing Sheets

MOLECULAR RULER FOR SCALING DOWN NANOSTRUCTURES

CROSS-REFERENCE TO RELATED APPLICATIONS

This application is a continuation of Provisional Application Ser. No. 60/209,377 filed Jun. 5, 2000, the disclosure of which is hereby specifically incorporated by reference.

GRANT REFERENCE

Work for this invention was funded in part by a grant from the United States Army Research Office, Army Research Office Grant No. DAAD 19-99-1-0269. Work for this invention was also funded in part by a grant from the Defense Advanced Research Projects Agency and the Office of Naval Research, DARPA/ONR Grant No. R13163-41600099, A04. Work for this invention was further funded in part by a grant from the National Science Foundation, Grant No. PHY-9983214. The government may have certain rights in this invention.

FIELD OF THE INVENTION

This invention relates generally to the field of nanofabrication. More specifically, the invention relates to methods of fabricating nanostructures using molecular multilayers and self assembly ruler. The invention provides for scaling down nanostructures using molecular science.

BACKGROUND OF THE INVENTION

The ability to construct increasingly small structures is of great importance in the fabrication of advanced electronic and optical electronic devices. Particularly, the construction of well defined devices having structures of less than 100 nanometers in size has been widely sought. Various attempts have been made to construct such devices. Techniques employed have included electronic-beam lithography. See P. Rai-Choudhury, Ed. *SPIE handbook of microlithography, micromachining and microfabrication* (SPIE, 1997) vol. 1. Other techniques have used a scanning probe microscope (SPM). See H. Sugimura, N. Nakagiri, *J. Am. Chem. Soc.* 119, 9226 (1997); M. A. Reed, J. Chen, C. L. Asplund, A. M. Cassell, M. L. Myrick, A. M. Rawlett, J. M. Tour, P. G. Van Patten, *Appl. Phys. Lett.* 75, 624 (1999); S. Hong, J. Zhu, C. A. Mirkin, *Science* 286, 523 (1999). Another technique is quantum dot (QD) deposition. See Y. Golan, L. Margulos, G. Hodes, I. Rubinstein, J. L. Hutchison, *Surf. Sci.* 311, 633 (1994). Yet another technique is nanotube assembly. See S. J. Tans, A. R. M. Verschueren, C. Dekker, *Nature* 393, 49 (1998); E. W. Wong, P. E. Sheehan, C. M. Lieber, *Science* 277, 1971 (1997); T. W. Ebbesen, H. J. Lezec, H. Hiura, J. W. Bennett, H. F. Ghaemi, T. Thio, *Nature* 382, 54 (1996); rod assembly; B. R. Martin, D. J. Dermody, B. D. Reiss, M. Fang, L. A. Lyon, M. J. Natan, T. E. Mallouk, *Adv. Mater.* 11, 1021 (1999). Yet another technique is membrane tubes deposition. See E. Evans, H. Bowman, A. Leung, D. Needham, D. Tirrell, *Science* 273, 933 (1996). Another technique is metal-coated DNA. See E. Braun, Y. Eichen, U. Sivan, g. Ben-Yoseph, *Nature* 391, 775 (1998). Despite all these different possible methods of creating nanostructures, problems and limitations remain.

For example, electronic beam lithography is often limited in its resolution below 100 nm due to proximity effects that may cause broadening of the desired pattern. See Y. Wang, S. Y. Chou, *J. Vac. Sci. Technol. B* 10, 2962 (1992). When portions of a pattern broaden, the result can be the merging or blurring of two adjacent structures. This is, of course, undesirable as it produces a structure different from that intended.

Using a scanning probe microscope for fabrication also has problems. One problem with this method is that it requires assembly of nanostructures one at a time. This resource intensive method limits the ability to construct an array that can span a macroscopic area.

There are also problems with using quantum dot deposition. Quantum dot deposition of small nanostructures results in heterogeneous distributions of structures, and the spacings between the dots cannot be precisely and broadly controlled. Therefore, the creation of precise nanostructures is problematic.

Methods involving nanotubes, membrane tubes, and rods are limited to predetermined widths and properties, and their ordered alignment on surfaces requires special techniques. These limitations make these techniques inappropriate for the creation of nanostructures for electronic devices.

In electronic circuit fabrication, using resists is known. Resists, however, are currently made of polymer and are spin-coated to make a nominally uniform layer on the substrates. Therefore, these resists are not selectively adsorbed to patterned areas on the surface, and do not yield precisely defined spacings, making them unsuitable for narrowing the gap between extremely small neighboring nanostructures in electronic devices.

In addition, monolayers have been proposed as resists, but defects in the monolayers tend to render these monolayer resists as not viable for use in constructing nanostructures.

As can be seen from the foregoing discussion, creating devices with nanoscale structures remains a considerable problem. Thus, a need exists in the art for a method of creating nanostructures that is capable of use in electronic component fabrication and in creating precisely spaced structures.

It is therefore an object of the present invention to provide a method for creating nanostructures that greatly improves over the state of the art.

It is another object of the present invention to provide a method of creating nanoscale structures that results in structures that are precise.

It is a further object of the present invention to provide a method for creating nanoscale structures that can be used to create structures less than 100 nm in width.

It is a further object of the present invention to provide a method for creating nanoscale structures that provides for precise spacing between nanoscale structures.

It is a further object of the present invention to provide a method for making nanoscale structures that permits complex patterns to be made.

It is a further object of the present invention to provide a method for making a nanoscale structures that permits a variety of structures to be created.

It is a further object of the present invention to provide a method of creating nanostructures that allows a number of different nanostructures to be constructed in a single fabrication process or in a series of simple steps.

It is a further object of the present invention to provide a method to reduce the size of fabricated structures.

Other objects of the invention will become apparent from the description of the invention and that which follows.

BRIEF SUMMARY OF THE INVENTION

A novel method of constructing nanoscale structures in close proximity with precise spacings is disclosed. The method uses step-by-step application of layers of organic molecules as size-controlled resists on a predetermined pattern such as those patterns formed by electron-beam lithography. The organic molecules of known dimensions serve as a ruler for scaling down a larger conventionally formed "parent" structure. Following metal deposition and lift-off of the organic multilayer resist, a new isolated smaller structure remains on the surface of a substrate. The method is used to create electronic components having the advantages of reduced dimensions and precise spacings.

Another aspect of the invention relates to the use of more complex patterning schemes through the selection of multilayer chemistry so that the multilayers adhere only to some of the initial pattern.

Another aspect of the invention is to remove selectively some of the organic multilayer from some traces chemically or using electrochemical means.

Another aspect of the invention involves repeating the process of the application of multilayer resist and deposition so as to make subsequent generation patterns. An aspect of this is to be able to remove intermediate, sacrificial generation patterns, or the parent structures from which nanostructures are created.

DETAILED DESCRIPTION OF THE INVENTION

The present invention is a method providing for the scaling down of nanostructures and the resulting nanoscale electronic components.

In the present invention, a novel nanofabrication method is disclosed, based on controlled-size molecular resist. The method is suitable for the creation of electronic components containing nanostructures. The invention combines molecular science with lithographic processes to result in nanostructures that could be used in and/or to connect electronic components.

Figure 1:
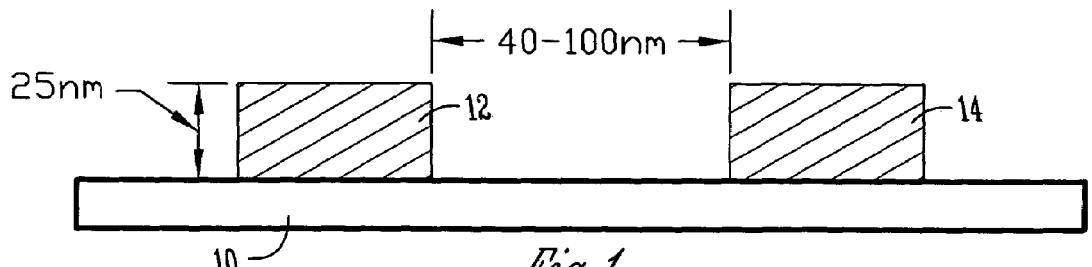
FIG. 1 is a schematic of the scaling down process showing an electron-beam pattern of parent lines or rings.

In FIG. 1, a substrate 10 is shown. The substrate may be a silicon substrate. Tests were conducted using a thermally oxidized highly polished doped Silicon substrate, Si(100). The present invention contemplates that other types of substrates may be used. The substrate is selected to ensure that essentially no multilayer resist adsorption occurs on the Si substrate.

A parent structure is deposited on the substrate. The parent structure of FIG. 1 includes trace 12 and trace 14. The parent structure is not limited to any particular pattern and may include any number of traces, including traces that form rings or other complex structures. The material used for the parent structure is selected to permit the construction of multilayers. For example, the traces of the parent structure may be gold, silver, copper, silicon, gallium arsenide, $SiO_2$, $Al_2O_3$, or $TiO_2$. Testing was performed with traces comprising a 5 nm Ti layer followed by a 20 nm Au layer.

The suitability of surface-oxidized Si as a substrate 10 and Au for use in defining a parent structure in conjunction with a particular organic molecule resist was tested and verified. Measured surface atomic concentration percentages were determined using X-ray photoelectron spectroscopy of surfaces of Au with a multilayer organic molecule resist applied, surfaces of oxidized Si with a multilayer organic molecule resist applied, and surfaces of clean (no multilayer organic molecule resist) surface-oxidized Si.

In the testing, an Au surface and a Si surface were treated with 9 processing steps of meracaptoalkanoic acid and $Cu^{2+}$ ion adsorption. The clean Si surface was not treated. Results of the testing showed the following:

| XPS atomic concentration % | C | O | Si | Au | Cu | S |
|---|---|---|---|---|---|---|
| Multilayer on gold | 84.1 | 6.9 | — | 0.5 | 3.7 | 4.7 |
| Multilayer on $SiO_2$ | 7.1 | 37.2 | 55.6 | — | 0.06 | 0.05 |
| Clean oxidized Si substrate | 6.8 | 33.1 | 60.1 | — | — | — |

The amount of C on the Au sample (84.1%) verifies the construction of the organic molecule multilayers on the surface. The small amount of C (7.1%) on the Si substrate to which multilayers were applied is similar to the amount of C (6.8%) on the surface of the clean Si substrate. This shows that essentially no multilayer is formed on the Si substrate. The trace amounts of S and Cu found on the Si substrate are much less than the percentages expected for full monolayer coverage. See T. Moav, A. Hatzor, H. Cohen, J. Libman, I. Rubinstein, A. Shanzer, *Chem. Eur. J.* 4, 502 (1998). Therefore these trace amounts can be attributed to residues from the adsorption process. In the manner described, the appropriateness of a particular substrate, a particular material for use in a parent structure, and potential chemicals for use in forming the multilayers can be determined.

In FIG. 1, the trace 12 and the trace 14 of the parent structure are 200 nm wide, 1000 nm long parallel traces. These traces were fabricated using e-beam lithography to have 40–100 nm spacings. The traces may be lines or rings. The present invention provides for numerous variations in the type of structure created.

Next, the multilayer organic resist is applied. The resist used to cover the traces 12 and 14 of the parent structure is prepared from metal-organic coordinated multilayers. See S. L. Clark, P. T. Hammond, *Adv. Mater.* 10, 1515 (1998). In the demonstration described here, the multilayers were constructed layer-by-layer on the Au traces. See S. D. Evans, A. Ulman, K. E. Goppert-Berarducci, J. L. Gerenser, *J. Am. Chem. Soc.* 113, 5866 (1991). The organic molecule used was a mercaptoalkanoic acid. The layers were connected by $Cu^{2+}$ ions. The aforementioned experiments confirmed suitability of the use of Si substrates with an Au parent structure in combination with this family of molecules. Multilayer construction on Si would have prevented gap formation between the Au parent traces. The molecules formed robust multilayers on alternating depositions of mercaptoalkanoic acid and $Cu^{2+}$ ion solutions.

These experiments were also performed to evaluate the thickness of the multilayer versus the number of layers. Table 1 also summarizes the X-ray photoelectron spectroscopy (XPS) results of the Au and Si substrates. A bare Si substrate was also measured in XPS as a reference for the amount of carbon present on a clean Si wafer (with native oxide on the surface). Ellipsometry measurements yielded a thickness of 18±0.5 nm for nine mercaptoalkanoic acid layers on Au. An average thickness of 2 nm per layer was measured for each processing step during multilayer construction. On a Si wafer substrate capped with oxide, the ellipsometric parameters show no significant change after the adsorption steps. The result verifies that essentially no adsorption of these multilayers occur on Si.

Figure 2:
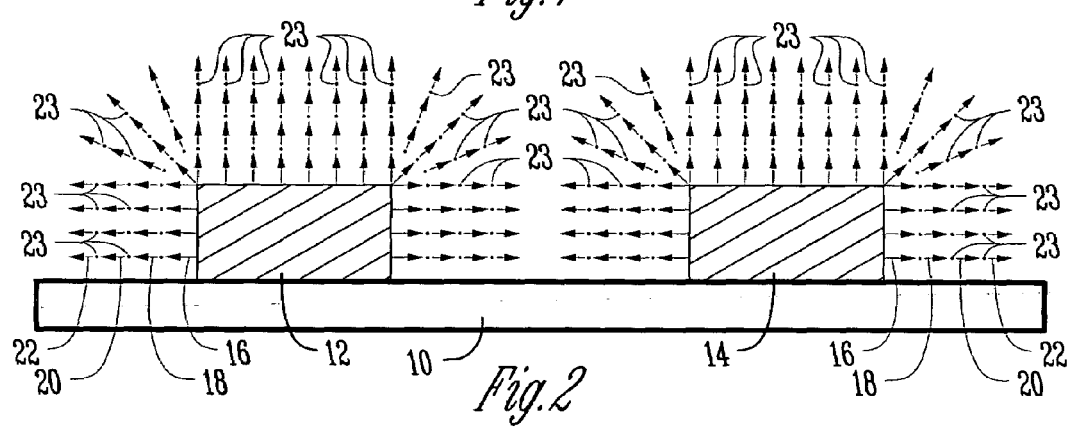
FIG. 2 is a schematic of the scaling down process showing an electron-beam pattern of parent lines or rings after a plurality of layers of organic resist have been applied.
Figure 5:
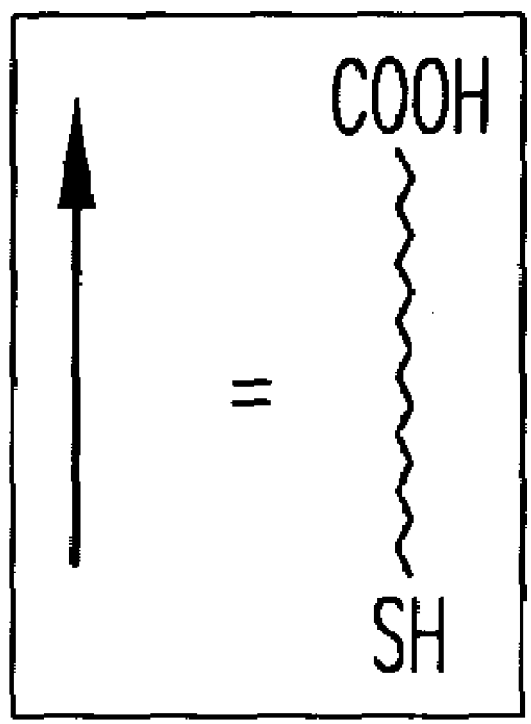
FIG. 5 is a diagrammatic representation of a layer of organic resist.

A number of layers are then constructed on the Au-patterned surfaces as shown in FIG. 2. In FIG. 2, layers 16, 18, 20, and 22 are shown. Each of the arrows of FIG. 2 represents the mercaptoalkanoic acid, the tail being the SH group and the head being a carboxylic group. A dot is used to represent the $Cu^{2+}$ ion 23 attached to a carboxylic acid or carboxylate group. This relationship is shown in FIG. 5. Returning to FIG. 2, four layers are represented in the multilayer. The present invention contemplates that any number of two or more layers may be used. In addition, the present invention contemplates that various multilayers may be used, including, but not limited to, $HS(CH_2)_{10}COOH$ and $HS(CH_2)_{15}COOH$, and $HS(CH_2)_n COOH$, for n=0 to 40.

Figure 3:
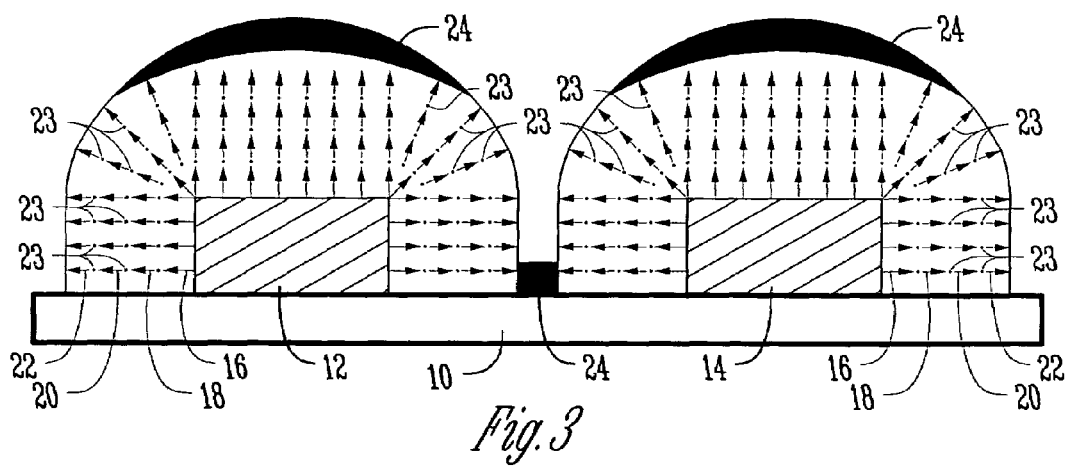
FIG. 3 is a schematic of the scaling down process showing metal evaporation into the gap between the electron-beam patterns and organic resist.

A second deposition was then performed as shown in FIG. 3. In FIG. 3, a 4.5 nm Ti and 4.5 nm Au layer 24 was deposited on top of the substrate 10, the parent structure's traces 12 and 14, and the layers of organic molecules 16, 18, 20, and 22. The present invention contemplates that other materials may be used for this deposition layer. As shown in FIG. 3, the layer 24 covers both the multilayers and the gap between the multilayers.

Next, the multilayer resist is removed. This can be performed in various ways. For example, the samples can be sonicated in a hot solution of 0.06 M HCl in 75 percent dimethylformamide (DMF) to remove both the resist and the metal that was deposited on top of the resist surface. Other solutions, known in the art, may be used to remove the resist and the metal deposited on top of the resist.

The resist removal was first checked by immersing a nine-layer mercaptoalkanoic acid-coated Au (each layer 2 nm) sample in an HCl/DMF solution and monitoring its thickness through ellipsometry. After 1 hour in the solution, the thickness of the multilayer on Au was reduced from 18 to 2 nm, indicating the removal of all but the first molecular layer.

Figure 4:
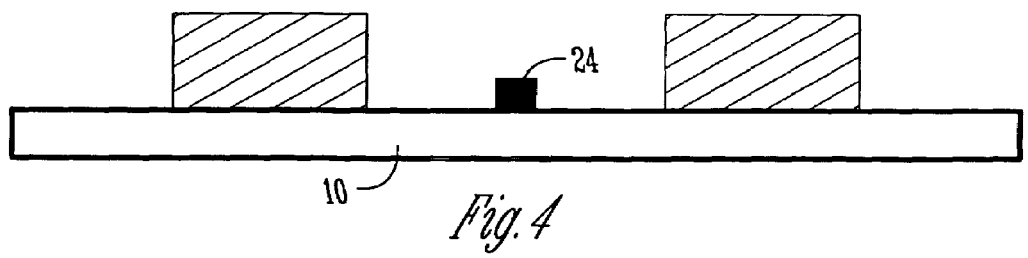
FIG. 4 is a schematic of the scaling down process showing the resulting pattern after lift-off of the organic resist.

As shown in FIG. 4, once the resist is removed and the metal deposited on top of the resist is removed, what remains is the residual portion of layer 24 that is between the first trace 12 and the second trace. The spacing and size of the residual portion of layer 24 is dependent upon the thickness of the multilayer resist. Because the multilayer resist is constructed of layers of molecule of precise thickness, a residual structure of precise size and spacing is created.

Figure 6:
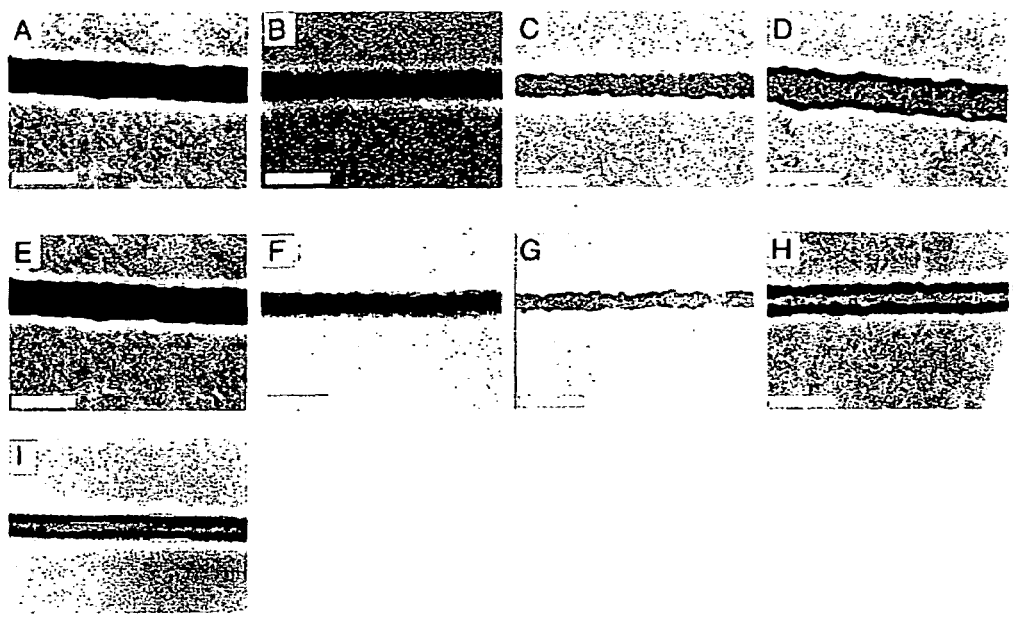
FIG. 6 is a series of field emission scanning electron microscopy (FESEM) images of the scaling down process.

FIG. 6 shows a series of field emission scanning electron microscopy (FESEM) images of the scaling down process. Different samples were used to obtain the above images in order to avoid damage during imaging due to the microscope's electron beam. The white bar in each image is 200 nm. In micrograph A, "parent" gold traces (bright) on oxidized Si (dark) are shown. The measured spacings between the pads is approximately 110 nm. In micrograph B, a 10-layer molecular ruler resist comprised of mercaptoalkanoic acid with a $Cu^{2+}$ linker, constructed on the Au traces is shown. The gap width is reduced to 80 nm. In micrograph C, a thin Ti/Au film is deposited on top of the multilayer resist. The gap width shown is now 66 nm. In micrograph D, after resist lift-off, a thin metal wire approximately 65 nm wide and 1 micron long is left on the surface, separated by a 20 nm gap from each of the parent gold traces. Micrographs E through H show the same process performed applying 20 layers of molecular resist, instead of 10, thus reducing the gap size and the width of the metal wire formed to 25 nm. It should be apparent from the results shown that the present invention provides for increased numbers of layers to reduce gap size as desired.

Micrograph I of FIG. 6 is a high-resolution FESEM image of a continuous, thin daughter trace placed between two parent electrodes 48 nm apart (gap shown on the right). The target gap separation was 18 nm, within experimental error of the 16-nm gap found (gap shown on the left).

Figure 7:
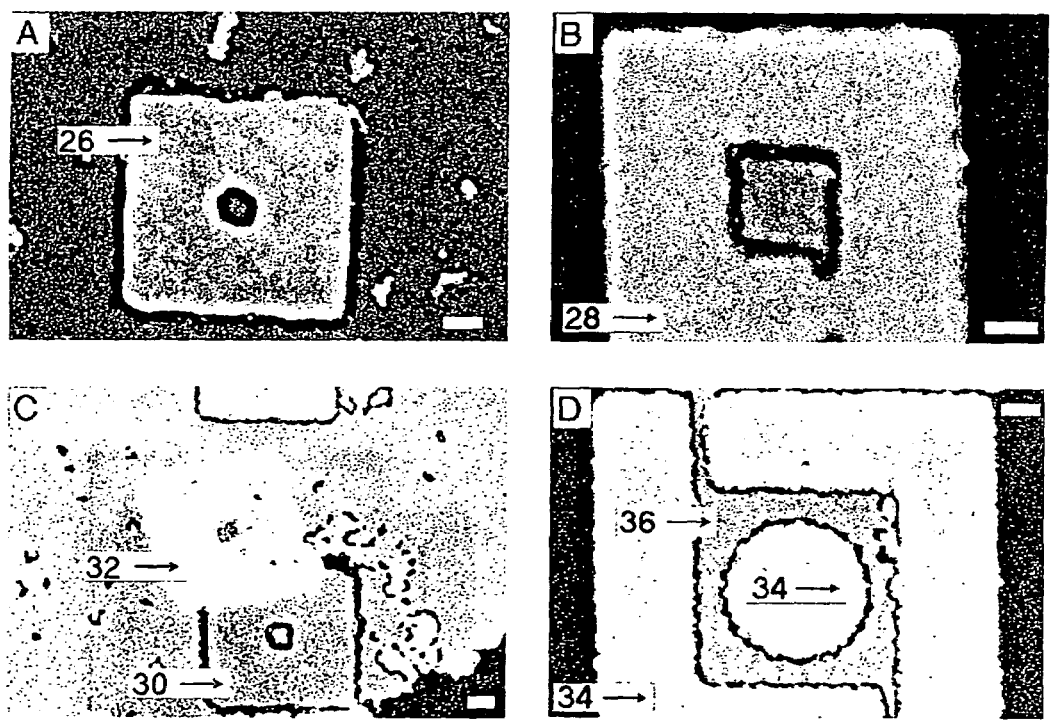
FIG. 7 is a series of FESEM images showing gold dots of different size and shape and a gold ring formed in the center of hollow parent structures.

FIG. 7 demonstrates a series of FESEM images showing gold dots of different size and shape and a gold ring formed in the center of hollow parent structures. The white scale bars shown are 100 nm. In micrograph A, a "parent" hollow gold square 26 on oxidized Si is shown. The circle in the center was formed by the second gold evaporation. The gap between the circle and the hollow square is the result of the lift-off process. In micrograph B, a "parent" gold hollow square of different hole size 28 is shown. The square in the center was formed similarly to the circle shown in micrograph A. In micrograph C, the second gold layer 32 that was lifted as one piece from the parent gold hollow square 30 is shown. The small gold square in the center of the hollow parent structure was formed by the second gold evaporation. Note the dimensions of the lifted layer that reflect the parent structure size plus the multilayer addition. In micrograph D, the scaling-down process forms a gold ring 36 connected to two thin gold channels on opposite sides. The gold channel size is approximately 15 nm. The ring and channels are formed in between a parent circle and two L-shaped structures 34.

Imaging at high resolution with SEM shows no indication of metal in the gaps that are formed. Since the multilayers are built sideways, the patterns are inherently robust with respect to defects in adjacent layers, since one continuous multilayer domain is sufficient to screen defects in adjacent layers on the side of the parent gold trace. The gap location accurately reflects the contours of the parent gold trace. Thus, complex structures can be scaled down in this way. Further, the gap size is determined by the molecular ruler. The central trace width of a residual structure is determined by the initial gap size minus twice the multilayer molecular ruler size. Numerous measurements for varying initial gap widths and shapes were consistent with this. The parent or intermediate structures can be prepared and enhanced prior to deposition of the multilayer. For example, the parent and/or intermediate structure can be smoothed chemically or electrochemically. This results in a smoother daughter or subsequent generation structure. Varying initial gap widths, molecular lengths, layer counts, parent structure lengths, and shapes have been tested.

The present invention allows more complex patterning schemes to also be used. To create more complex patterning schemes, the multilayer chemistry can be selected to adhere only to some of the initial pattern. Selecting the multilayer chemistry so that the multilayer will only adhere to some of the initial pattern can be accomplished by having the parent structure patterning be in more than one material. For example, different metals can be used. The functional group used to attach the multilayer is then selected to adhere only to one or some of the materials. For example, Au and $SiO_2$ in combination with additional materials to discriminate between. The suitability of other materials can be determined similarly to the manner in which the suitability of these materials is determined.

The present invention contemplates numerous other variations. For example, different methods may be used to remove the resist. Rather than purely chemical means to remove the resist, since binding the multilayers changes the bond strength of the attached atoms to the underlying material, the resist may be removed in the development step with more precise control by applying a potential to the patterned surface. This could be used to desorb the resist and/or the top atomic layer of the substrate. This circumvents the roughening of patterns sometimes found in lift-off processes.

A further aspect of the invention is to remove selectively some of the traces of the parent structure using chemical or electrochemical means to provide for more complex patterning schemes. For example, voltages are applied to selected traces that are already patterned to remove resist electrochemically or to deposit resist electrochemically. In another variation, an applied voltage is used to deposit material onto the surfaces of the traces selectively activated to which the multilayer will then adhere. Similarly, the applied voltage may be used to remove material on the surfaces of the traces selectively activated to which multilayers will then not bind. In this manner, more complex structures are created.

A further aspect of the invention involves repeating the entire multilayer/deposition process to make subsequent generation structures. One aspect of this is that the initial structures or intervening generation structures or parts thereof can be removed or enhanced according to methods of the present invention, including through use of concave segments in these parent or intervening generation structures.

In summary, a simple, convenient method for constructing sub-100 nm structures has been demonstrated based on the application of a controlled-sized molecular ruler as a resist. This method offers the advantages of precisely determining nanostructure size and spacing, and of circumventing the proximity effects that limit conventional e-beam lithography. This method is applicable to a variety of structures, e.g. wires, dots and rings, and can be used to construct structures down to less than approximately 3 nm in size. This scheme enables the fabrication of arrays of wires or dots in a single fabrication process. A large variety of metals, semiconductors, insulators, or other materials can be used for the constructed patterns.

The present invention contemplates variations in the substrates, the material used for the parent structure, the techniques that are used to create and/or to modify the parent structure, the metal organic resist, the structure being built-in, the selective removal or enhancement of the structures, and the electronic or other component being created. This and other variations are within the spirit and scope of the invention.

What is claimed is:

1. A method for manufacturing nanostructure patterns comprising;
    overlaying a parent structure selectively deposited on a substrate with a plurality of organic molecules, each of said plurality having a metal ion coordinating portion adsorbing on the parent structure in preference to the substrate to form a deposit consisting of an organic molecule single layer contacting the parent structure;
    applying a metal ion solution to the organic molecule single layered parent structure to attach the metal ion to the metal ion coordinating portion of the organic molecules;
    forming an organic molecule single layer attached to the metal ion;
    depositing a layer over the at least one parent structure and in contact with at least a portion of the organic molecule single layer; and
    removing the organic molecule single layer contacting the parent structure and the organic molecule layer to leave a residual structure.

2. The method of claim 1 wherein the step of removing the organic molecule single layer contacting the parent structure is chemical.

3. The method of claim 1 wherein the step of removing the organic molecule single layer contacting the parent structure is electrochemical.

4. The method of claim 1 wherein the step of removing the organic molecule single layer contacting the parent structure removes a portion of the layer deposited.

5. The method of claim 1 wherein the residual structure includes a line.

6. The method of claim 1 wherein the residual structure includes a dot.

7. The method of claim 1 wherein the residual structure includes a ring.

8. The method of claim 1 wherein the residual structure includes two or more adjacent lines.

9. The method of claim 1 wherein a first portion of the at least one parent structure is a first material and a second portion of the at least one parent structure is a second material.

10. The method of claim 1 further comprising imaging the residual structure with electron microscopy.

11. The method of claim 1 further comprising imaging the residual structure with scanning probe microscopy.

12. The method of claim 1 wherein the substrate is silicon.

13. The method of claim 1 wherein the organic molecule is a mercaptoalkanoic acid.

14. The method of claim 1 wherein the organic molecule single layer contacting the parent structure and the organic molecule single layer are connected with ions.

15. The method of claim 14 wherein the ions are $Cu^{2+}$ ions.

16. The method of claim 1 further comprising smoothing the at least one parent structure.

17. The method of claim 16 wherein smoothing is accomplished chemically.

18. The method of claim 16 wherein smoothing is accomplished electrochemically.

19. The method of claim 1 further comprising designing the at least one parent structure to result in the residual structure having a width less than a width of the at least one parent structure.

20. The method of claim 19 wherein the step of designing comprises designing the at least one parent structure to have at least one concave segment.

21. The method of claim 1 further comprising removing a portion of the residual structure.

22. The method of claim 1 further comprising:
overlaying at least a portion of the residual stricture with a second organic molecule having a metal ion coordinating portion adsorbing on the residual structure in preference to the substrate to form an organic molecule single layer contacting the residual structure;
applying a metal ion solution to the organic molecule single layer contacting the residual structure to attach the metal ion to the metal ion coordinating portion of the second organic molecule;
forming a second organic molecule single layer to the metal ion;
depositing a second layer over the residual structure and in contact with at least a portion of the second organic molecule single layer; and
removing the second organic molecule single layer contacting the residual structure and the organic molecule single layer to leave a second residual structure.

23. The method of claim 22 further comprising smoothing the residual structure.

24. The method of claim 23 wherein smoothing is accomplished chemically.

25. The method of claim 23 wherein smoothing is accomplished electrochemically.

26. The method of claim 22 further comprising designing the residual structure to reduce the second residual structure size.

27. The method of claim 22 wherein the second layer adheres only to the residual structure.

28. The method of claim 22 further comprising removing a portion of the second residual structure.

29. The method of claim 22 further comprising removing a portion of a subsequent generation residual structure.

30. The method of claim 1 further comprising designing the at least one parent structure to result in the residual structure being spaced more closely than the at least one parent structure.

31. The method of claim 1 further comprising the step of:
repeating in sequence the steps of applying the metal ion solution and forming the organic molecule single layer.

32. The method of claim 31 wherein the repetition step is repeated until up to 39 layers of the organic molecule single layer are formed.

33. The method of claim 1 wherein the substrate is a silicon oxide.

* * * * *